United States Patent
Park et al.

(10) Patent No.: US 9,407,202 B2
(45) Date of Patent: Aug. 2, 2016

(54) SPIN-TRANSFER TORQUE TYPE INJECTION LOCKING OSCILLATOR AND DESIGN METHOD THEREOF

(71) Applicant: KOREA ADVANCED INSTITUTE OF SCIENCE AND TECHNOLOGY, Daejeon (KR)

(72) Inventors: ChulSoon Park, Daejeon (KR); SeongJun Cho, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 14/440,983

(22) PCT Filed: Oct. 16, 2013

(86) PCT No.: PCT/KR2013/009244
§ 371 (c)(1),
(2) Date: May 6, 2015

(87) PCT Pub. No.: WO2014/073798
PCT Pub. Date: May 15, 2014

(65) Prior Publication Data
US 2015/0303873 A1    Oct. 22, 2015

(30) Foreign Application Priority Data
Nov. 8, 2012 (KR) .................. 10-2012-0126036

(51) Int. Cl.
*H03L 7/24* (2006.01)
*H03B 15/00* (2006.01)
(Continued)

(52) U.S. Cl.
CPC .............. *H03B 15/006* (2013.01); *B82Y 25/00* (2013.01); *G01R 33/093* (2013.01);
(Continued)

(58) Field of Classification Search
CPC ............ B82Y 25/00; H03L 7/23; H03L 7/24; H03B 27/00; H03B 15/006; G01R 33/093; G01R 33/098; G01R 33/1284; G06F 17/5068; H01L 43/12
USPC ........... 365/173; 428/811; 257/422; 360/324, 360/313; 331/2, 96, 55, 46; 977/838
See application file for complete search history.

(56) References Cited

U.S. PATENT DOCUMENTS

| 8,049,567 B2 | 11/2011 | Persson et al. |
| 2009/0066428 A1 | 3/2009 | Badets .................. B82Y 25/00 331/49 |
| 2009/0115541 A1 | 5/2009 | Persson et al. |

FOREIGN PATENT DOCUMENTS

| KR | 10-2010-0107583 A | 10/2010 |
| KR | 10-2011-0036205 A | 4/2011 |
| KR | 10-1284687 B1 | 7/2013 |

OTHER PUBLICATIONS

Houssameddine et al., Applied Physics Letters 93(2008).
(Continued)

*Primary Examiner* — Arnold Kinkead
(74) *Attorney, Agent, or Firm* — Rabin & Berdo, P.C.

(57) ABSTRACT

The present invention provides a spin-transfer torque type injection locking oscillator which improves both power and noise performance by using pair of spin-transfer torque devices. One is optimized for high power and the other is optimized for low noise characteristics. The output signal of the low noise spin-transfer torque device is injected into the high output power spin-transfer torque for phase locking. The present invention has several advantages such as the miniaturization, the high quality and low cost, and the mass production of integrated chips by the nanoscale.

16 Claims, 5 Drawing Sheets

(51) Int. Cl.
- *H03L 7/23* (2006.01)
- *B82Y 25/00* (2011.01)
- *H03B 27/00* (2006.01)
- *H01F 10/32* (2006.01)
- *G01R 33/09* (2006.01)
- *G01R 33/12* (2006.01)
- *H01L 43/12* (2006.01)
- *G06F 17/50* (2006.01)

(52) U.S. Cl.
CPC ......... *G01R 33/098* (2013.01); *G01R 33/1284* (2013.01); *H01F 10/329* (2013.01); *H01L 43/12* (2013.01); *H03B 27/00* (2013.01); *H03L 7/23* (2013.01); *H03L 7/24* (2013.01); *G06F 17/5068* (2013.01)

(56) References Cited

OTHER PUBLICATIONS

Manfrini et al., Applied Physics Letters 95(2009).

Shehzaad Kaka et al., "Mutual phase-locking of microwave spin torque nano-oscillators", Natures, Sep. 15, 2005, pp. 389-392, vol. 437.

Behzad Razavi, "A Study of Injection Locking and Pulling in Oscillators", IEEE Journal of Solid-State Circuits, Sep. 2004, pp. 1415-1424, vol. 39, No. 9.

W. H. Rippard et al., "Injection Locking and Phase Control of Spin Transfer Nano-oscillators", Pyhsical Review Letters, Aug. 5, 2005, pp. 067203-1-067203-4, vol. 95.

SPIN-TRANSFER TORQUE TYPE INJECTION LOCKING OSCILLATOR AND DESIGN METHOD THEREOF

TECHNICAL FIELD

The present invention relates to a spin-transfer torque type injection locking oscillator, and more specifically, to a spin-transfer torque type injection locking oscillator that improves both output power and noise performance by using a pair of spin-transfer torque devices which are optimized for high output power and low noise, respectively.

BACKGROUND ART

A spin-transfer torque oscillator is an oscillator which generates specific frequency signal resulted from spin precession inside magnetic-nonmagnetic multilayer structure by applying current to it. The spin-transfer torque oscillator has several advantages compared to prior art oscillators. These advantages are the nanometer scale structure fabrication using CMOS manufacturing process and the generation of wide range signals from a few MHz to GHz by varying input current. However, disadvantages of the spin-transfer torque oscillator are very low output levels in the range of nV and high phase noise characteristics.

The prior art inventions describe injection locking and mutual locking techniques for phase locking of spin oscillator as disclosed in the non-patent reference 1, 2, and 3. In this regard, the non-patent reference 1 reported that two nano-contact spin torque devices in the mutual phase locking are synchronized with a sudden narrowing of signal line-width with an increase in output power due to the coherence of the individual oscillators. However the output power of the oscillator is still in the range of a few pW, which is not suitable for telecommunication circuits. Injection locking uses locking or pulling phenomenon of periodic signals inside an oscillator as disclosed in the non-patent reference 2 and 3 experimentally and theoretically. The phase noise is reduced by locking the oscillating frequency into injection frequency. This is called as injection locking which makes the signal attenuation when input signal and oscillator signal having phase differences are combined, and at that time the phase has to vary to synchronize the phase of oscillator to the phase of injection signal for the maintaining of oscillation. However, the locking range in the silicon CMOS manufacturing process is very narrow and the phase noise reduction effect of the injection locking lacks of reliability due to the lack of suitable models and manufacturing process change. Moreover, the nanoscale integration advantage may disappear because additional oscillator is needed for injection locking.

THE NON-PATENT REFERENCES (The non-patent reference 1) S. Kaka et al., "Mutual phase-locking of microwave spin torque nano-oscillators", Nature, Vol. 437, pp. 389-392, 15 Sep. 2005.
(The non-patent reference 2) B. Razavi, "A study of injection locking and pulling in oscillators", IEEE Journal of Solid-State Circuits, Vol. 39, pp. 1415-1424, September 2004.
(The non-patent reference 3) W. H. Rippard et al., "Injection locking and phase control of spin transfer nano-oscillators", Physical Review Letters, Vol. 95, 067203, 5 Aug. 2005.

DISCLOSURE

Technical Problem

In order to solve the above problems, the present invention provides a spin-transfer torque type injection locking oscillator having both high output power and low phase noise characteristics by employing injection locking method using two oscillators. One is optimized for high output power characteristics and the other is optimized for low noise characteristics in the device manufacturing processing.

Technical Solution

According to the present invention in order to solve the above problems, the design method of the spin-transfer torque type injection locking oscillator comprises, the steps of: designing the structure of a low noise spin-transfer torque device; designing a high output power spin-transfer torque device; designing an injection oscillator using the low noise spin-transfer torque device; designing a free running oscillator using the high output power spin-transfer torque device; and designing an injection locking oscillator using the injection oscillator and the free running oscillator. The spin-transfer torque type injection locking oscillator has low noise and high output power characteristics.

In a preferable embodiment of the present invention, a spin-transfer torque type injection locking oscillator comprises an injection oscillator and a free running oscillator, which are a low noise spin-transfer torque device as the injection oscillator operated by current control and a high output power spin-transfer torque device as the free running oscillator operated by current control. The high output power spin-transfer torque device generates output signals by receiving output signals of the low noise spin-transfer torque device.

Advantageous Effects

The present invention can overcome disadvantages of a spin-transfer torque oscillator such as low output power and high phase noise characteristics by using injection locking method which combines two spin-transfer torque devices. One of two spin-transfer torque devices is fabricated as the optimized output power characteristics device while the other is fabricated as the optimized noise characteristics device in the device manufacturing process.

The present invention can reduce production cost of high quality spin-transfer torque device by removing alternative power supply and alternative generation circuits of additional injection oscillators and by integrating spin-transfer torque devices in nanoscale using CMOS process. The spin-transfer torque type injection locking oscillator can be used for FSK, ASK, and PSK modulator of wireless telecommunication systems.

MODE OF THE PRESENT INVENTION

Hereinafter, exemplary embodiments of the present invention will be described with drawings. In each drawing of the present invention, a size may be enlarged or reduced than an actual size to clarify the invention, and well known elements are omitted to emphasize a structural feature of the present invention.

Figure 1:
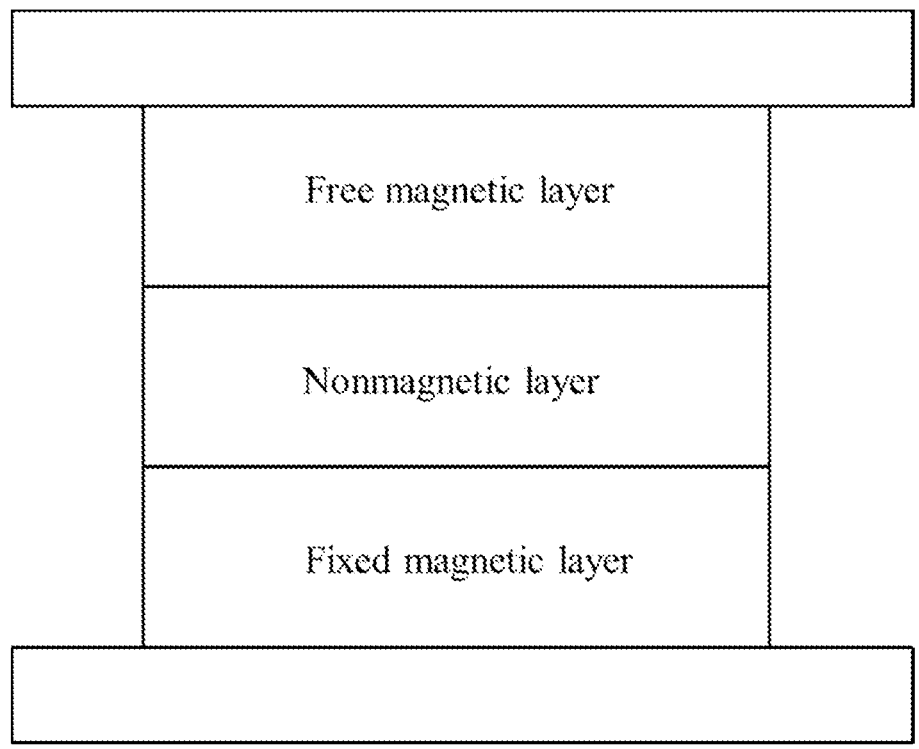
FIG. 1 illustrates a cross sectional view of a spin-transfer torque device according to the present invention.

Generally a spin-transfer torque device consists of multi-layer structure of fixed magnetic layer/nonmagnetic layer/free magnetic layer as illustrated in FIG. 1, but may not be limited to that structure. Electrons in the spin-transfer torque device by applying current experience spin polarization when they are passing through nonmagnetic layer and magnetic layer. Since spin angular momentum of each electron has to be conserved, force corresponding to the change of spin angular momentum of each electron transfers to the magnetization of magnetic layer and consequently generates torque against the change of the magnetization direction of magnetic layer.

When certain amount of magnetic field or spin-transfer torque is simultaneously applied to a spin-transfer torque device to move opposite of the magnetization direction each other, the magnetization does not move to the direction of magnetic field or spin-transfer torque but rotate continually with constant frequency. The constant rotating frequency changes with changing the magnitude of applied magnetic field or current and can be controlled in the wide range of frequency from a few GHz to dozens of GHz. As the magnetization of free magnetic layer rotates with respect to the fixed direction of the magnetization of fixed magnetic layer, the magnetoresistance of the spin-transfer torque device changes continuously. That means it is possible to obtain alternative current signal from direct current signal and thus the spin-transfer torque device can be used as an oscillator.

A spin-transfer torque device can be embodied in a nano-contact or a nano-pillar structure using silicon CMOS manufacturing process. The nano-contact structure is fabricated on the multilayer structure of fixed magnetic layer/nonmagnetic layer/free magnetic layer by forming a contact window on the top layer to form electrodes. The nano-pillar structure is fabricated on the multilayer structure of fixed magnetic layer/nonmagnetic layer/free magnetic layer by etching outside of the multilayer structure to form a pillar. A free magnetic layer consists of soft magnetic materials which changes the magnetization direction by the applied magnetic field or current. A nonmagnetic layer consists of nonmagnetic metals or insulators. The nonmagnetic layer of an insulator should be thin for the tunneling of electrons or holes. A fixed magnetic layer consists of ferromagnetic materials which does not change the magnetization direction by the applied magnetic field or current. A spin-transfer torque device may become tunneling magneto-resistance (TMR) device by using an insulator for the nonmagnetic layer or a giant magneto-resistance (GMR) device by using a conducting layer for the nonmagnetic layer. A free magnetic layer may be a layer which includes magnetic vortex.

Figure 2:
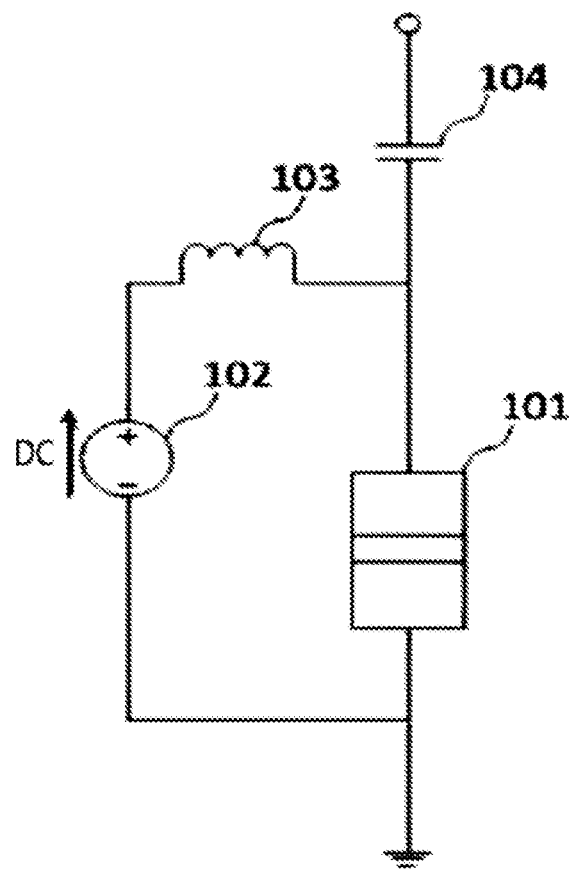
FIG. 2 illustrates a circuit diagram of a spin-transfer torque oscillator which operated in basic mode according to a prior art.

FIG. 2 illustrates a basic circuit of a spin-transfer torque oscillator, which includes a spin-transfer torque device 101, a direct current source 102, an inductor 103, and a capacitor 104. High frequency signal is generated by applying direct current on the spin-transfer torque device 101 using the direct current source 102. The direct current component in the signals is blocked by the capacitor 104 and then high frequency signal only comes out in the output.

A spin-transfer torque device shows various oscillation frequency characteristics according to the amount of applied currents. One spin-transfer torque device increases oscillation frequency as increasing applied current according to materials used in magnetic layers, on the contrary the other spin-transfer torque device decreases oscillation frequency as increasing applied current. Or certain spin-transfer torque device decreases and after that increases as increasing applied current. Affecting factors on oscillation frequency in a spin-transfer torque device are degree of magnetic saturation freedom, magnetic attenuation constant, and spin polarization parameter, which are determined by material property parameters and form factors such as volume of a free magnetic layer. Thus spin-transfer torque oscillators with different oscillation frequencies or noise characteristics can be made by controlling volume, surface area, or thickness of the free magnetic layer.

Phase noise which well known as flicker noise (1/f noise) is known to be caused by material property and thus a spin-transfer torque device with low phase noise can be made by selecting certain magnetic materials. A spin-transfer torque device can be optimized by adjusting certain conditions as changing frequency as well as output signals and noise characteristics with increasing applied current. The magnetic layer is at least one or more, or their alloys selected from the group consisting of cobalt, nickel, chrome, platinum, boron, and iron. For example, Ni, NiFe, Co, CoFe, CoFeB, CoPt, or CoCrPt can be used, but the use may not be limited to them. Crystal structure of materials may be body centered cubic (BCC). Magnetization direction of magnetic layer can be selected by combining parallel or perpendicular directions of the magnetization like fixed magnetic layer.

Since a spin-transfer torque device has low output power and high phase noise, the array of spin-transfer torque device can be used for the improvement of output power and phase noise using mutual locking and synchronization method. The spin-transfer torque type injection locking oscillator according to the present invention uses the combining method of two different spin-transfer torque devices optimized using different materials and shapes in the CMOS manufacturing process. One is optimized for output power characteristics and the other is optimized for noise characteristics.

Low phase noise spin-transfer torque device can be made of magnetic layer having magnetic vortex. Magnetic vortex which spin direction's shape resembled vortex of tornado is randomly formed in the free magnetic layer. A spin-transfer torque oscillator with magnetic vortex structure involves more magnetic fields in an oscillation due to difference of shape. Thus the oscillation frequency becomes less dependent on the change of magnetic field and consequently has very narrow line width since the swing range of the oscillation frequency by magnetic field is relatively low. A spin-transfer torque oscillator with magnetic vortex layer has low output power and low phase noise.

A high output power spin-transfer torque oscillator can be made of TMR structure spin-transfer torque device. Since a spin-transfer torque oscillator which made of TMR structure normally has very high resistance, a high output power oscillator is obtained. A spin-transfer torque oscillator which made of TMR structure has high output power and high noise.

Figure 3:
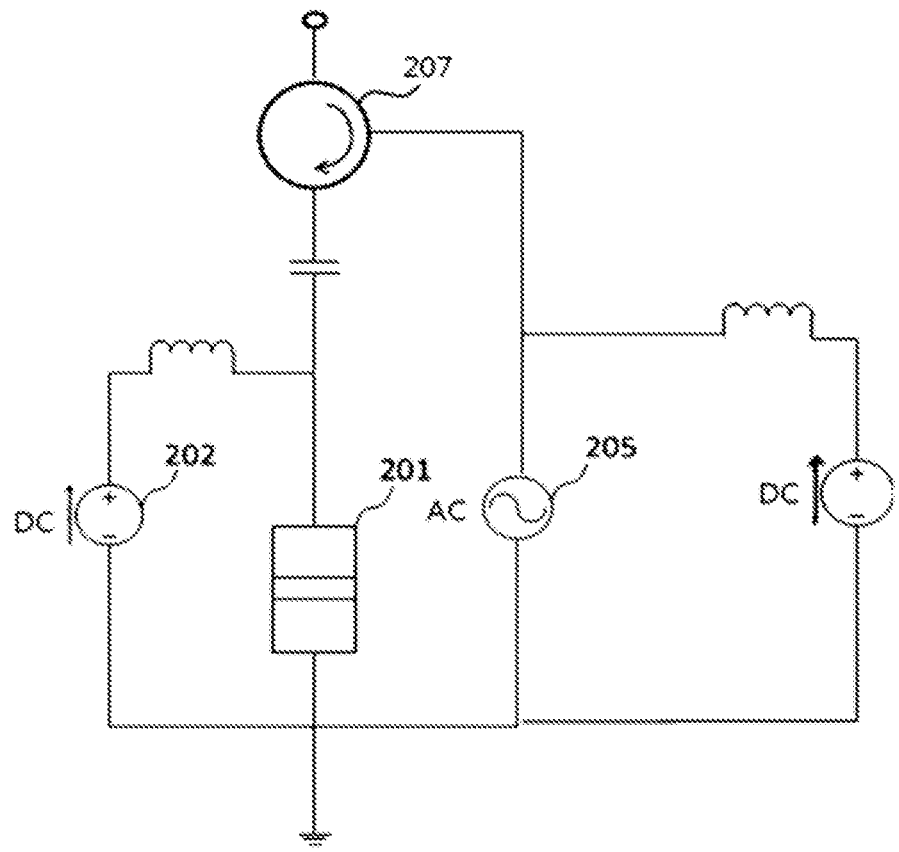
FIG. 3 illustrates a circuit diagram of a spin-transfer torque oscillator comprising high frequency oscillating injection circuit for the operation of general injection locking according to a prior art.

FIG. 3 illustrates an injection locking oscillator according to prior art invention. A spin-transfer torque oscillator 201 is used as a free running oscillator and an external oscillator 205 such as voltage controlled oscillator (VCO) is used as an injection oscillator. The locking range $\Delta f_{lock}$ is described in mathematical formula 1.

$$f_{drive} - f_o = \Delta f_{lock} \sin(\varphi); \Delta f_{lock} = \frac{\Delta f}{2} \frac{v_{inj}}{v_{osc}}$$  Mathematical formula 1

Here, $f_{drive}$ is the frequency of an injection oscillator, $f_o$ is the frequency of a free running oscillator, $V_{inj}$ is the alternative voltage of an injection oscillator, $V_{osc}$ is the output voltage of a free running oscillator, $\varphi$ is the phase difference between a free running oscillator and an injection oscillator. An injection oscillator according to prior art invention has difficulty of integration in nanoscale due to the use of VCO.

Figure 4:
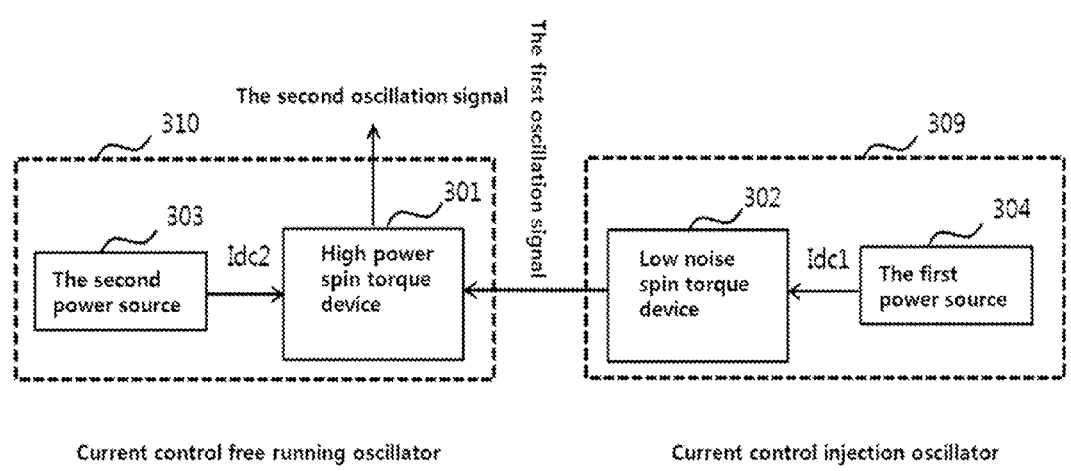
FIG. 4 illustrates a block diagram of the spin-transfer torque type injection locking oscillator according to the present invention.

FIG. 4 illustrates a block diagram of a spin-transfer torque type injection locking oscillator according to the present invention, which includes a current control injection oscillator 309 and a current control free running oscillator 310. The current control injection oscillator 309 consists of a low noise spin-transfer torque device 302 and the first power supply 304 and the current control free running oscillator 310 consists of a high output power spin-transfer torque oscillator and the second power supply 303. The low noise spin-transfer torque device 302 operates as an oscillator and generates low noise oscillation output signals by controlling the first direct current (Idc1) of the first power supply 304. The high output power spin-transfer torque oscillator 301 operates as an oscillator by controlling the second direct current (Idc2) of the second power supply 303. The low noise signal generated by the low noise spin-transfer torque device 302 is injected into the high output power spin-transfer torque oscillator 301 and then the high output power spin-transfer torque oscillator 301 generates oscillation output signals which are synchronized in phase with low noise oscillation signals.

Since a spin-transfer torque oscillator according to the present invention uses spin-transfer torque devices, it can be operated by direct current as well as direct voltage. The low noise spin-transfer torque device 302 is a spin-transfer torque oscillator which is optimized for phase noise characteristics and the high output power spin-transfer torque oscillator 301 is a spin-transfer torque oscillator which is optimized for output power characteristics. They can be exchangeable.

The output signal of a free running oscillator is equal or increased when the phase signal of a free running oscillator is locked by injection, and the phase noise of output signals is equal or reduced to the phase of an injection oscillator. Thus, it is possible to embody an oscillator having both high output power and low phase noise characteristics. The oscillator can be fabricated using CMOS manufacturing process with the nanoscale integration due to simple circuits by using direct current usage only.

Figure 5:
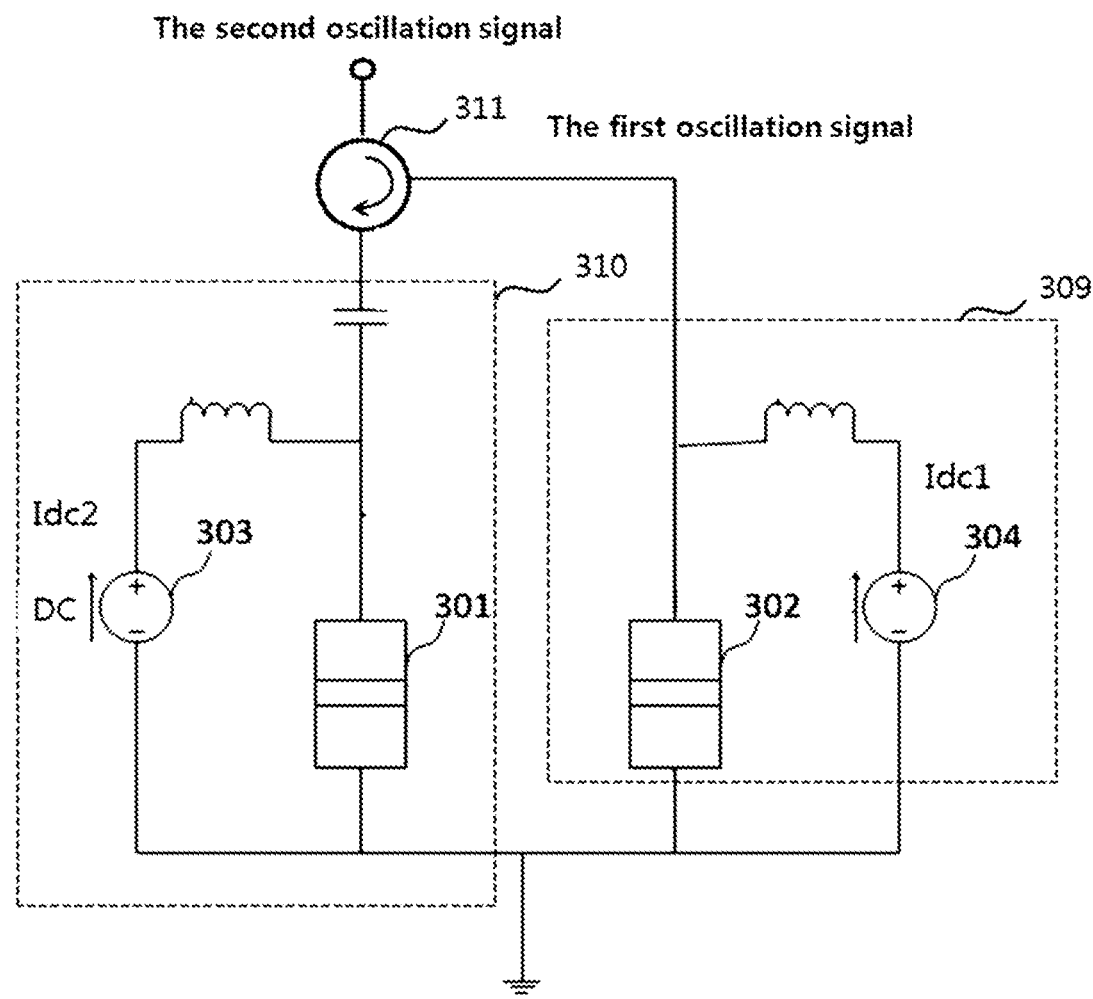
FIG. 5 shows an embodiment of the spin-transfer torque type injection locking oscillator described in FIG. 4.

FIG. 5 illustrates a circuit diagram of a spin-transfer torque oscillator according to the present invention, which includes the first power supply 304, the low noise spin-transfer torque device 302, a coupler 311, the second power supply 303, and the high output power spin-transfer torque oscillator 301. The low noise spin-transfer torque device 302 generates low noise oscillation output signals by controlling the first direct current (Idc1) of the first power supply 304, and the high output power spin-transfer torque oscillator 301 is controlled by the second direct current (Idc2) of the second power supply 303. The low noise signal generated by the low noise spin-transfer torque device 302 is injected into the high output power spin-transfer torque oscillator 301 and then the high output power spin-transfer torque oscillator 301 operates as a free running oscillator and generates low noise oscillation output signals.

The coupler 311 is a part to guide the direction of output signals to avoid interference between high frequency signals. A directional coupler, a combiner, or a circulator can be used. The coupler 311 inputs the output of the current control injection oscillator 309 to the current control free running oscillator 310, but prevents from inputting the output of the current control free running oscillator 310 to current control the injection oscillator 309.

Since a spin-transfer torque oscillator is easy for the integration, an integrated chip can be made by integrating a pair of the low noise spin-transfer torque device and the high output power spin-transfer torque oscillator using CMOS manufacturing process. As a spin-transfer torque type injection locking oscillator according to the present invention improves low output power and high phase noise, it can be used as FSK, ASK, or PSK modulator in wireless telecommunication system.

INDUSTRIAL APPLICABILITY

The present invention can apply to an oscillator, a modulator, a transmitter and receiver, and telecommunications.

What is claimed is:
1. A spin-transfer torque type injection locking oscillator, comprising:
   a low noise spin-transfer torque device operating as an injection oscillator by current control;
   a high output power spin-transfer torque device operating as a free running oscillator by current control; and
   a coupler coupling an output terminal of the low noise spin-transfer torque device and an input terminal of the high output power spin-transfer torque device,
   wherein the high output power spin-transfer torque device outputs signals by receiving output signals of the low noise spin-transfer torque device.
2. The spin-transfer torque type injection locking oscillator of claim 1, wherein the high output power spin-transfer torque device is an array formed by a plurality of spin-transfer torque devices.
3. The spin-transfer torque type injection locking oscillator of claim 1, wherein the coupler is a direction coupler, a combiner, or a circulator.
4. The spin-transfer torque type injection locking oscillator of claim 1, wherein the low noise spin-transfer torque device includes a structure of magnetic vortex.
5. The spin-transfer torque type injection locking oscillator of claim 1, wherein the low noise spin-transfer torque device and the high output power spin-transfer torque device is operate by voltage control instead of the current control.
6. A spin-transfer torque type injection locking oscillator, comprising:
   a high output power spin-transfer torque device operating as an injection oscillator by current control;
   a low noise spin-transfer torque device operating as a free running oscillator by current control; and
   a coupler coupling an output terminal of the high output spin-transfer torque device and an input terminal of the low noise spin-transfer torque device,
   wherein the high output power spin-transfer torque device generates output signals by receiving output signals of the low noise spin-transfer torque device.

7. The spin-transfer torque type injection locking oscillator of claim 6, wherein the high output power spin-transfer torque device is an array formed by a plurality of spin-transfer torque devices.

8. The spin-transfer torque type injection locking oscillator of claim 6, wherein the coupler is a direction coupler, a combiner, or a circulator.

9. The spin-transfer torque type injection locking oscillator of claim 6, wherein the low noise spin-transfer torque device includes a structure of magnetic vortex.

10. The spin-transfer torque type injection locking oscillator of claim 6, wherein the low noise spin-transfer torque device and the high output power spin-transfer torque device operate by voltage control instead of the current control.

11. A spin-transfer torque type injection locking oscillator, comprising:
- a current control injection oscillator including
  - a low noise spin-transfer torque device operating by current control, and
  - a first power supply supplying a first current to the low noise spin-transfer torque device;
- a current control free running oscillator including
  - a high output power spin-transfer torque device operating by current control, and
  - a second power supply supplying a second current to the high output power spin-transfer torque device;
- a coupler coupling an output terminal of the low noise spin-transfer torque device and an input terminal of the high output power spin-transfer torque device, wherein the current control free running oscillator outputs signals by receiving output signals of the current control injection oscillator.

12. The spin-transfer torque type injection locking oscillator of claim 11, wherein the high output power spin-transfer torque device is an array formed by a plurality of spin-transfer torque devices.

13. The spin-transfer torque type injection locking oscillator of claim 11, wherein the coupler is a direction coupler, a combiner, or a circulator.

14. The spin-transfer torque type injection locking oscillator of claim 11, wherein the low noise spin-transfer torque device includes a structure of magnetic vortex.

15. The spin-transfer torque type injection locking oscillator of claim 11, wherein the low noise spin-transfer torque device and the high output power spin-transfer torque device operate by voltage control instead of the current control.

16. The spin-transfer torque type injection locking oscillator of claim 11, wherein the first current supplied to the low noise spin-transfer torque device and the second current supplied to the high output power spin-transfer torque device are different in magnitude each other.

* * * * *